(12) United States Patent
Oh et al.

(10) Patent No.: US 6,721,210 B1
(45) Date of Patent: Apr. 13, 2004

(54) VOLTAGE BOOSTING CIRCUIT FOR A LOW POWER SEMICONDUCTOR MEMORY

(75) Inventors: Seung Cheol Oh, San Jose, CA (US); Paul S. Lazar, Santa Clara, CA (US)

(73) Assignee: Nanoamp Solutions, Inc., San Jose, CA (US)

( * ) Notice: Subject to any disclaimer, the term of this patent is extended or adjusted under 35 U.S.C. 154(b) by 0 days.

(21) Appl. No.: 10/232,852

(22) Filed: Aug. 30, 2002

(51) Int. Cl.$^7$ ................................................. G11C 7/00
(52) U.S. Cl. ................................... 365/189.09; 365/226
(58) Field of Search ....................... 365/189.09, 189.11, 365/226, 230.06, 230.08

(56) References Cited

U.S. PATENT DOCUMENTS

| | | | |
|---|---|---|---|
| 4,503,522 A | * | 3/1985 | Etoh et al. .................. 365/203 |
| 5,287,325 A | * | 2/1994 | Morita ..................... 365/230.06 |
| 5,367,489 A | | 11/1994 | Park et al. .............. 365/189.11 |
| 5,579,276 A | | 11/1996 | Yoon et al. .................. 365/226 |

* cited by examiner

*Primary Examiner*—Son Mai
(74) *Attorney, Agent, or Firm*—Patrick T. King

(57) ABSTRACT

An improved voltage boosting circuit operates entirely from a single, common VCC voltage supply. An NMOS pass transistor has a gate input terminal to which is connected a gate boost capacitor and a PMOS precharge circuit. A drain terminal of the NMOS pass transistor is connected to a drain boost capacitor and to a drain precharge circuit. The gate boost capacitor is precharged from the common VCC voltage. The second terminal of the precharged gate boost capacitor is connected to the common VCC voltage level to thereby boost the precharged gate input terminal voltage to 2 VCC. The drain of the NMOS pass transistor has a similar boost capacitor and precharge configuration. Another embodiment further includes an additional gate preboost capacitor and a gate preboost precharge circuit for boosting the gate voltage to 3 VCC to more efficiently drive the NMOS pass transistor.

13 Claims, 3 Drawing Sheets

VOLTAGE BOOSTING CIRCUIT FOR A LOW POWER SEMICONDUCTOR MEMORY

BACKGROUND OF THE INVENTION

1. Field of the Invention

This invention relates to semiconductor memory circuits and, more particularly, to an improved voltage boosting circuit for a wordline driver for a dynamic random access memory.

2. Prior Art

The power consumed in a semiconductor memory varies as the square of the supply voltage. Therefore, to conserve power, it is advantageous to operate memory circuits at lower supply voltages. In certain low-power memory circuit designs, the operating supply voltage may actually be chosen to be even lower than the operating supply voltage that is targeted for a particular process technology. For example, in a 0.18 micron dynamic random access memory DRAM process technology, voltages lower than 1.8 volts are considered to be low. In this case, DRAMs would require a boosted wordline voltage to operate properly.

Prior boost circuits provide boost capacitors in series with the gate terminal and the drain terminal of a pass transistor that drive a DRAM wordline. Some of these prior art boost circuits do not operate efficiently. FIG. 4 of U.S. Pat. No. 5,579,276 shows two capacitors, one in series with the gate of a pass transistor and the other in series with the drain of the pass transistor. This patent does not show any pre-charge circuit nor does it describe any circuit for precharging the capacitor A separate VCC voltage supply is required for the circuits that drive the boost capacitors.

Consequently, a need exists for a technique that efficiently generates a required boosted voltage for an SRAM when the operating voltage of the circuits is low and without the need for a separate voltage supply for the drivers of boost capacitors.

SUMMARY OF THE INVENTION

The present invention provides a PMOS pre-charge circuit for precharging a node to be boosted with the substrate of the PMOS precharging device connected to the same boosted node. Cutoff is provided for the precharging operation using an associated gate that turns off the PMOS precharging device when a node is boosted.

The gate terminal of the output pass transistor is boosted to a higher voltage by a circuit, which uses two boost capacitors. The higher voltage on the gate causes the boost voltage to be efficiently driven to the output node of the output pass transistor. In a further embodiment of the invention, the gate circuit of the output pass transistor is boosted to a higher 3 VCC voltage by a circuit which uses a pre-boost capacitor and a boost capacitor such that the higher voltage on the gate causes the drain boost voltage to be efficiently driven to the output terminal.

One embodiment of the present invention provides an improved voltage boosting circuit that boosts the output voltage of an NMOS pass transistor that functions as a wordline driver for a DRAM. The boosting circuit operates entirely from a single, common VCC voltage supply and has a gate input terminal to which is connected a gate boost capacitor and a PMOS precharge circuit. A drain terminal of the NMOS pass transistor is connected a drain boost capacitor and to a drain precharge circuit. A source output terminal of the NMOS pass transistor provides a boosted output voltage vh for a wordline of the DRAM.

The gate boost capacitor has a first terminal connected to the gate input terminal of the NMOS pass transistor and has a second terminal. A gate precharge circuit is connected to the gate input terminal of the NMOS pass transistor for precharging the first terminal of the gate boost capacitor from the common VCC voltage supply. The gate precharge circuit has a PMOS gate precharge transistor that has its source terminal connected to the common VCC voltage supply and that has a drain terminal and a substrate terminal connected together in common to the first terminal of the gate boost capacitor.

Means are provided for connecting the second terminal of the gate boost capacitor to a common ground while the gate precharge circuit precharges the first terminal of the gate boost capacitor from the common VCC voltage supply to provide a precharged gate boost capacitor. Means are also provided for connecting the second terminal of the precharged gate boost capacitor to the common VCC voltage level to thereby boost the precharged gate input terminal voltage to 2 VCC.

The drain boost capacitor has a first terminal connected to the drain input terminal of the NMOS pass transistor and has a second terminal. A drain precharge circuit is connected to the drain terminal of the NMOS pass transistor for precharging the drain terminal of the NMOS pass transistor with the common VCC voltage supply. The drain precharge circuit has a PMOS drain precharge transistor that has its source terminal connected to the common VCC voltage supply and that has its drain terminal and a substrate terminal connected together in common to the drain terminal of the NMOS pass transistor to precharge the drain terminal of the NMOS pass transistor to VCC.

Means are provided for connecting the second terminal of the drain boost capacitor to a common ground, while the drain precharge circuit precharges the first terminal of the drain boost capacitor from the common VCC voltage supply to provide a precharge drain boost capacitor. Means are also provided for connecting the second terminal of the drain boost capacitor to the common VCC voltage level to thereby boost the precharged drain terminal voltage to 2 VCC.

The voltage boosting circuit provides a boosted output voltage for a wordline of the DRAM at a level of 2 VCC minus the threshold voltage for the NMOS pass transistor.

The means for connecting the second terminal of the gate boost capacitor to the common ground and the means for connecting the second terminal of the precharge gate boost capacitor to the common VCC voltage include a CMOS gate circuit having an input terminal and having an output terminal that is connected through a PMOS pullup transistor to the common VCC voltage to thereby boost the gate voltage of the NMOS pass transistor to twice the VCC voltage or that is alternatively connected through an NMOS transistor to ground voltage during precharging of the gate boost capacitor.

Similarly, the means for connecting the second terminal of the drain boost capacitor to the common ground and the means for connecting the second terminal of the precharged drain boost capacitor to the common VCC voltage include a CMOS gate circuit having an input terminal and having an output terminal that is connected through a PMOS pullup transistor to the common VCC voltage to thereby boost the drain voltage of the NMOS pass transistor to twice the VCC voltage and that is alternatively connected through an NMOS pulldown transistor to ground voltage during precharging of the drain boost capacitor.

The PMOS gate precharge transistor has a gate terminal that is connected to an output terminal of a CMOS precharge inverter that has an NMOS pulldown transistor and a PMOS pullup transistor having a source terminal connected to the first terminal of the gate boost capacitor and to the gate terminal of the NMOS pass transistor. Similarly, the PMOS drain precharge transistor has a gate terminal that is connected to an output terminal of a CMOS precharge inverter that has an NMOS pulldown transistor and a PMOS pullup transistor having a source terminal connected to the first terminal of the drain boost capacitor and to the drain terminal of the NMOS pass transistor.

A logic circuit is provided that receives a high-voltage enable signal avhe and that provides control signals for activating the gate precharge circuit and the drain precharge circuit or alternatively for boosting the voltage on the gate and drain terminals of the NMOS pass transistor to provide a boosted output voltage vh for a wordline of a DRAM.

Another embodiment of the invention is similar to the first embodiment and further includes a gate preboost capacitor having a first terminal connected to a gate preboost terminal and having a second terminal. A gate preboost precharge circuit is connected to the gate preboost terminal for pre-charging the first terminal of the gate preboost capacitor from the common VCC voltage supply. The said gate preboost precharge circuit has a PMOS precharge transistor that has its source terminal connected to the common VCC voltage supply and has a drain terminal and a substrate terminal connected together in common to the first terminal of the gate preboost capacitor and to the gate preboost terminal.

Means are provided for connecting the second terminal of the gate preboost capacitor to a common ground while the gate preboost precharge circuit precharges the first terminal of the preboost capacitor from the common VCC voltage supply to provide a precharged gate preboost capacitor. Means are also provided for connecting the second terminal of the precharged gate preboost boost capacitor to the common VCC voltage to thereby boost the precharged gate preboost terminal voltage to 2 VCC.

The second embodiment of the invention also has a gate boost and a gate precharge circuit that has a PMOS gate precharge transistor that has its source terminal connected to the gate preboost terminal and that has a drain terminal and a substrate terminal connected together in common to the first terminal of the gate boost capacitor. Means are provided for connecting the second terminal of the gate boost capacitor to a common ground while the gate precharge circuit precharges the first terminal of the gate boost capacitor from the common VCC voltage supply to provide a precharged gate boost capacitor. Means are also provided for connecting the second terminal of the precharged gate boost capacitor to the precharge terminal that has been precharged to 2 VCC to thereby boost the precharged gate input terminal voltage to 3 VCC. A drain boost capacitor has a first terminal connected to the drain input terminal of the NMOS pass transistor and has a second terminal. A drain precharge circuit is connected to the drain terminal of the NMOS pass transistor for precharging the drain terminal of the NMOS pass transistor with the common VCC voltage supply. The drain precharge circuit has a PMOS drain precharge transistor that has its source terminal connected to the common VCC voltage supply and has its drain terminal and a substrate terminal connected together in common to the drain terminal of the NMOS pass transistor to precharge the drain terminal of the NMOS pass transistor Means are provided for connecting the second terminal of the drain boost capacitor to a common ground, while the drain precharge circuit precharges the first terminal of the drain boost capacitor from the common VCC voltage supply to provide a precharge drain boost capacitor. Means are also provided for connecting the second terminal of the drain boost capacitor to the common VCC voltage level to thereby boost the precharged drain terminal voltage to 2 VCC and to provide a boosted output voltage for a wordline of a DRAM at a level of 2 VCC minus the threshold voltage for the NMOS pass transistor.

BRIEF DESCRIPTION OF THE DRAWINGS

The accompanying drawings, which are incorporated in and form a part of this specification, illustrate embodiments of the invention and together with the description, serve to explain the principles of the invention.

DETAILED DESCRIPTION OF THE PREFERRED EMBODIMENTS

Reference is now made in detail to preferred embodiments of the invention, examples of which is illustrated in the accompanying drawings. While the invention is described in conjunction with the preferred embodiments, it will be understood that they not intended to limit the invention to these embodiments. On the contrary, the invention is intended to cover alternatives, modifications and equivalents, which may be included within the spirit and scope of the invention as defined by the appended claims.

Figure 1:
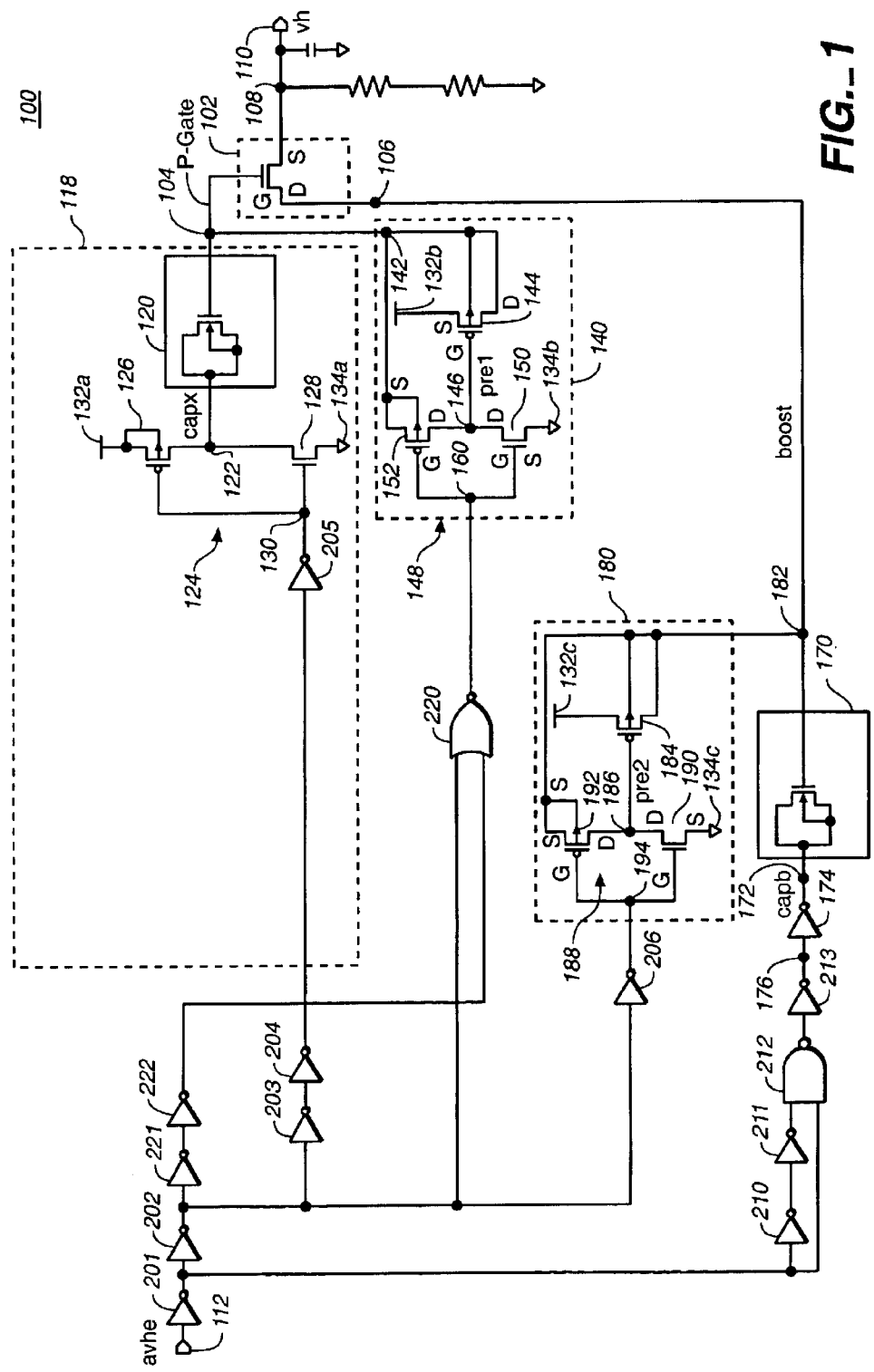
FIG. 1 is a circuit diagram of a boost circuit that uses series boost capacitors and pre-charge circuits for the gate and drains terminals of a series pass transistor.

FIG. 1 is a circuit diagram of a boost circuit 100 that uses series boost capacitors and pre-charge circuits to efficiently pre-charges the gate and source terminals of an output transistor that provides a boosted wordline signal to a DRAM. The boost circuit 100 operates from a single, common 1.5 volt VCC voltage supply. A voltage boost circuit develops an output voltage that exceeds the supply voltage provided to that circuit. As previously mentioned, to conserve power, it is advantageous to operate semiconductor memory circuits at lower supply voltages and to provide voltage boost circuits to supply wordline voltage. For a 0.18 micron DRAM process technology, voltages lower than 1.8 volts require a boosted wordline voltage to operate properly.

The boost circuit 100 boosts the output voltage vh of a wordline driver transistor, or pass transistor, 102 that drives a wordline of a dynamic random access memory (DRAM). The pass transistor 102 is an NMOS transistor having a gate input terminal 104, a drain terminal 106, and a source output terminal 108 that is connected to an output terminal 110, at which is provided a boosted, higher output voltage vh. The boosted, higher output voltage vh is provided by the boost circuit 100 in response to a high voltage enable signal avhe provided at an input terminal 112.

A gate boost capacitor circuit 118 includes a gate boost capacitor 120 that is provided as an NMOS transistor that has a first terminal connected to the gate input terminal 104 of the NMOS pass transistor 102. Terminal 104 has a P-gate signal. A second terminal of the gate boost capacitor 120 is connected to an output terminal 122 of a CMOS inverter 124 formed with a PMOS pullup transistor 126 and an NMOS pulldown transistor 128. Terminal 122 has a capx signal. The CMOS inverter 124 has an input terminal 130 that is connected to the gate terminals of the PMOS pullup transistor 126 and the NMOS pulldown transistor 128.

When the PMOS pullup transistor 126 is turned on with a LOW input signal level at input terminal 130, the CMOS inverter 124 provides a means for connecting the second terminal for the gate boost capacitor 120 at terminal 122 to a common VCC voltage supply terminal 132a. In this example, the VCC voltage supply is, for example, 1.5 volts. Other VCC voltage supply voltages are used, as required.

Alternatively, when the NMOS transistor 128 is turned on with a HIGH signal at terminal 130, the CMOS inverter alternatively provides a means for connecting the second terminal of the gate boost capacitor to a common ground voltage terminal 134a.

A gate precharge circuit 140 has a precharge output terminal 142 that is connected to the gate input terminal 104 of the NMOS pass transistor 102 for precharging the first terminal of the gate boost capacitor 120 from the common VCC voltage supply 132b. This embodiment of the gate precharge circuit includes a PMOS precharge transistor 144 that has its source terminal connected to the common VCC voltage supply 132b. A drain terminal and a substrate terminal of the PMOS precharge transistor 144 are connected together in common to the precharge output terminal 142 and to the first terminal of the gate boost capacitor and the gate input terminal 104 of the NMOS pass transistor 102.

The PMOS precharge transistor 144 has a gate terminal that is connected to an output terminal 146 of a CMOS inverter 148. The CMOS inverter provides a precharge control signal pre1 to control the PMOS precharge transistor. The CMOS inverter 148 has an NMOS pulldown transistor 150 that has its source terminal connected to a common ground voltage terminal 134b and that has its drain terminal connected to the output terminal 146 of the CMOS gate 148. The CMOS inverter 148 also has a PMOS pullup transistor 152 that has its drain terminal connected to the output terminal 146 and to the gate terminal of PMOS precharge transistor 144. A source terminal and a substrate terminal of the PMOS pullup transistor are connected together in common to the precharge output terminal 142 and to the gate terminal 104 of the NMOS pass transistor. The NMOS pulldown transistor 150 and the PMOS pullup transistor 152 have their gate terminals connected together in common to an input terminal 160. The NMOS transistor 128 connects terminal 120 to ground when the gate terminal 104 is being precharged. The PMOS transistor 126 connects terminal 120 to VCC to boost the gate terminal 104 to twice the VCC level.

For the drain terminal of the NMOS pass transistor 102, a drain boost capacitor 170 is configured with an NMOS transistor that has a first terminal connected to the drain terminal 106 of the NMOS pass transistor 102. A second terminal of the drain boost capacitor 170 is connected to an output terminal 172 of a CMOS inverter 174 that is similar to the CMOS inverter 124, described herein above, and has an output signal capb. The CMOS inverter 174 includes a PMOS pullup transistor and an NMOS pulldown transistor that have the gate terminals thereof connected to an input terminal 176 of the CMOS inverter 174.

When the PMOS pullup transistor of the CMOS inverter 174 is turned on with a LOW input level at terminal 176, the CMOS inverter 174 provides a means for connecting the second terminal for the drain boost capacitor 170 at terminal 172 to the common VCC voltage supply terminal that is the same as the common VCC voltage supply terminals 132a. Alternatively, when the NMOS pulldown transistor is turned on with a HIGH signal at terminal 176, the CMOS inverter 174 alternatively provides a means for connecting the second terminal of the drain boost capacitor 170 to a common ground voltage terminal that is the same as the common ground 134a during precharging of the dram boost capacitor 170.

A drain precharge circuit 180 has a precharge output terminal 182 that is connected to the drain terminal 106 of the NMOS pass transistor 102 for precharging the first terminal of the drain boost capacitor 170 from the common VCC voltage supply. The signal at terminal 182 is called boost. This embodiment of the gate precharge circuit includes a PMOS precharge transistor 184 that has its source terminal connected to the common VCC voltage supply 132c. A drain terminal and a substrate terminal of the PMOS precharge transistor 184 are connected together in common to the precharge output terminal 182 and to the first terminal of the gate boost capacitor 170 as well as the gate input terminal 106 of the NMOS pass transistor 102.

The PMOS precharge transistor 184 has a gate terminal that is connected to an output terminal 186 of a CMOS inverter 188 that has a precharge control signal pre2. The CMOS inverter 188 has an NMOS pulldown transistor 190 that has its source terminal connected to a common ground voltage terminal 134c and that has its drain terminal connected to the output terminal 186 of the CMOS gate 188. The CMOS inverter 188 also has a PMOS pullup transistor 192 that has its drain terminal connected to the output terminal 186 and to the gate terminal of PMOS precharge transistor 184. A source terminal and a substrate terminal of the PMOS pullup transistor are connected together in common to the precharge output terminal 182 and to the drain terminal 106 of the NMOS pass transistor 102. The NMOS pulldown transistor 190 and the PMOS pullup transistor 192 have their gate terminals connected together in common to an input terminal 194. The NMOS transistor 190 grounds terminal 172 of the DRAM boost capacitor 170 during precharge. The PMOS transistor 192 connects terminal 172 to VCC to boost the drain terminal 106 of the NMOS pass transistor 102 to twice VCC.

During precharge, the boost capacitors 120, 70 are charged to VCC by the precharge circuit. During boost, the boost capacitors 120, 170 are put in series with VCC to provide 2 VCC voltages. The vh output signal at terminal 110 is 2 VCC minus the threshold voltage vth. For VCC equal to 1.5 volts and a threshold voltage of 0.7 volts, $v_h$ is boosted to 2.3 volts to drive a DRAM wordline.

FIG. 1 shows various serial strings of inverters and a logic gate that provide control signals from the avhe input enable signal at the input terminal 112 to respective input terminals of the CMOS inverters 124, 174 for grounding and boosting the respective boost capacitors 120, 170. Various other serial strings of inverters and a logic gate provide control signals from the avhe input signal at input terminals 112 to respective input terminals 160, 194 of the CMOS inverters 148,188 for the respective precharge circuits 140,180.

For the gate boost capacitor circuit, the avhe signal passes through inverters 201, 202, 203, 204, 205. When the avhe signal is active HIGH, the input signal at the gates of the CMOS inverter 124 is LOW so that the terminal 122 at the gate boost capacitor 120 is connected to VCC through the PMOS pullup transistor 126. When the avhe signal is inactive LOW, the signal at the gate of the CMOS inverter 124 is HIGH so that the terminal 122 of the gate boost capacitor 120 is connected to ground through the NMOS pulldown transistor 128 while node 104 is being charged to VCC by the precharge circuit 140.

For the drain boost capacitor circuit, the avhe signal passes through the inverter 201 and through inverters 210, 211 to one input terminal of a 2-input NAND gate 212. The other input terminal of the 2-input NAND gate 212 is connected to an output terminal of the inverter 201. An output terminal of the 2-input NAND gate 212 is connected through an inverter 213 to the input terminal 176 of the CMOS inverter 174.

When the avhe signal is active HIGH, the input signal at the input terminal 176 of the CMOS inverter 174 goes LOW so that the terminal 172 at the drain boost capacitor 170 is connected to VCC through a PMOS pullup transistor in the CMOS inverter 174. When the avhe signal is inactive LOW, the signal at the input terminal 176 of the CMOS inverter 172 is HIGH so that the terminal 172 of the drain boost capacitor 170 is connected to ground through an NMOS pulldown transistor in the CMOS inverter 174.

For the gate precharge circuit 140, the avhe signal passes through the inverters 201, 202 to one input terminal of a 2-input NOR gate 220. The output terminal of the inverter 202 is also connected through inverters 221, 222 to another input terminal of the 2-input NOR gate 220.

For the gate precharge circuit 140, when the avhe signal is in active LOW, the input terminal 160 of the CMOS inverter 148 is HIGH so that the NMOS pulldown transistor 150 is turned on with a LOW output level at terminal 146 which turns on the PMOS precharge transistor 144 to precharge the gate terminal 104 of the NMOS pass transistor 102 to a VCC level. When the avhe signal is inactive LOW, the input terminal 160 of the CMOS inverter 148 is LOW so that the PMOS pullup transistor 152 is turned on with a HIGH output level at terminal 146 which turns off the PMOS precharge transistor 144.

For the drain precharge circuit 180, when the avhe signal is active HIGH, the input terminal 194 of the CMOS inverter 188 is LOW which turns on the PMOS pullup transistor 192 to turn off the PMOS precharge transistor 184. When the avhe signal is inactive LOW, the input terminal 194 of the CMOS inverter 188 is HIGH which turns on the NMOS pulldown transistor 190 and turns on the PMOS precharge transistor 184.

Figure 2:
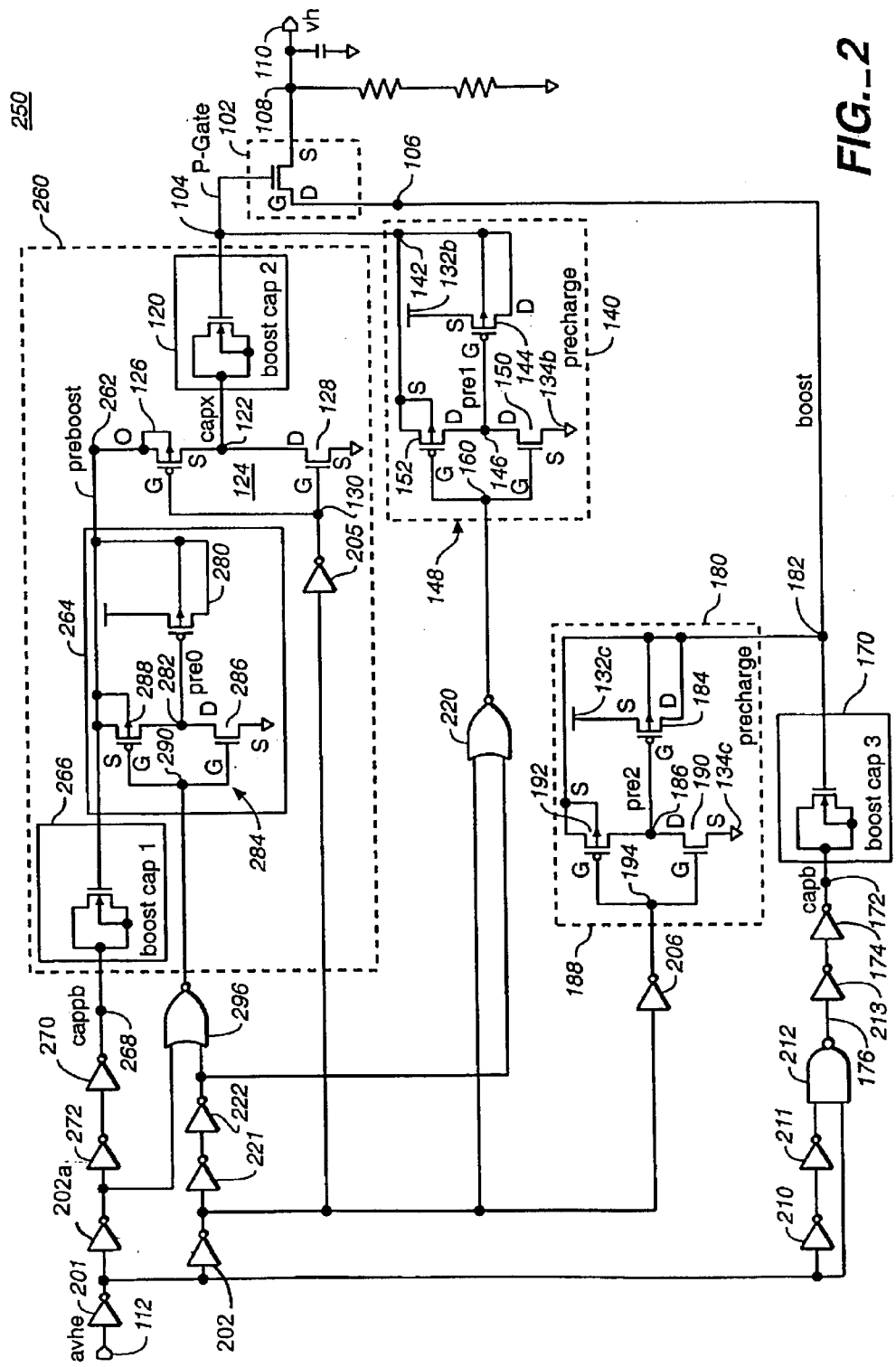
FIG. 2 is a circuit diagram of a boost circuit that uses boost and preboost capacitors and two pre-charge circuits in the gate circuit of a series pass transistor.

FIG. 2 is a circuit diagram of a boost circuit 250 that is similar to the boost circuit 118 described in connection with FIG. 1. The same reference numerals are used for circuit elements that are common to both Figures. The boost circuit 250 of FIG. 2 has additional elements for boosting the gate terminal 104 of the NMOS output pass transistor 102 to a higher voltage than 2 VCC provided by FIG. 1 by using two boost capacitors in the gate boost circuit. The higher boost voltage on the gate 104 of the output pass transistor causes the boost voltage to be more efficiently delivered to the output node 108 of the NMOS output pass transistor 102. The gate boost circuit of this embodiment of the invention uses two boost capacitors and two pre-charge circuits in the gate circuit of the series pass transistor 102.

In this embodiment, the drain terminal 262 of the PMOS pullup transistor 126 of the CMOS inverter 124 is connected to a preboost node 262. The preboost node 262 is provided with a preboost voltage using another precharge circuit 264 and one terminal of a gate preboost capacitor 266. The gate preboost capacitor 266 is an NMOS transistor that has a first terminal connected to the preboost node 262. A second terminal of the gate preboost capacitor 266 is connected to an output terminal 268 of a CMOS inverter 270 formed with a PMOS pullup transistor and an NMOS pulldown transistor. The CMOS inverter 270 has an input terminal that is connected through another inverter 272 and through inverters 201, 202 to the input terminal 112 for the high-voltage enable signal avhe.

When the PMOS pullup transistor of the CMOS inverter 270 is turned on with a HIGH input level at its input terminal, the CMOS inverter 270 provides a means for connecting the second terminal of the gate preboost capacitor 266 to the common VCC voltage supply terminal to boost the preboost node to 2 times VCC.

Alternatively, when the NMOS pulldown transistor of the CMOS inverter 270 is turned on with a LOW signal at its input terminal, the CMOS inverter alternatively provides a means for connecting the second terminal of the gate preboost capacitor 260 to a common ground voltage terminal during precharging of the gate preboost capacitor 266.

The preboost precharge circuit 264 has a preboost precharge output terminal that is connected to the preboost node 262 for precharging the drain terminal of the PMOS pullup transistor 126 of the CMOS inverter 124 with the common VCC voltage supply. The preboost precharge circuit includes a PMOS preboost precharge transistor 280 that has its source terminal connected to the common VCC voltage supply. A drain terminal and a substrate terminal of the PMOS preboost precharge transistor 280 are connected together in common to the preboost node 262.

The PMOS preboost precharge transistor 280 has a gate terminal that is connected to an output terminal 282 of a CMOS inverter 284. The CMOS inverter 284 has an NMOS pulldown transistor 286 that has its source terminal connected to a common ground voltage terminal and that has its drain terminal connected to the output terminal 282 of the CMOS gate 284. The CMOS inverter 284 also has a PMOS pullup transistor 288 that has its drain terminal connected to the output terminal 282 and to the gate terminal of the PMOS preboost precharge transistor 280. A source terminal and a substrate terminal of the PMOS pullup transistor 288 are connected together in common to the preboost node 262. The NMOS pulldown transistor 286 and the PMOS pullup transistor 288 have their gate terminals connected together in common to an input terminal 290.

The input terminal 290 of the CMOS inverter 284 is connected to the output terminal of a 2-input NOR gate 296. One input terminal of the 2-input NOR gate 296 is connected to the output terminal of the inverter 222. The other input terminal of the 2-input NOR gate 296 is connected to the output terminal of the inverter 202. When the avhe signal is active HIGH, the input signal at the gates of the CMOS inverter 270 is LOW so that the terminal 268 at the gate preboost capacitor 266 is connected to VCC through the PMOS pullup transistor of the CMOS inverter 270 to boost the voltage at the preboost node 262 to 2 times VCC.

When the avhe signal is inactive LOW, the signal at the gate of the CMOS inverter 270 is HIGH so that the terminal 268 of the gate preboost capacitor 266 is connected to ground through the NMOS pulldown transistor of the CMOS inverter 270 during precharge.

For the preboost precharge circuit 264, the avhe signal passes through inverters 201, 202a to one input terminal of the 2-input NOR gate 296. The avhe signal also passes through inverters 201, 221, 222, 203 to the other input terminal of the 2-input NOR gate 292. For the gate preboost precharge circuit, when the avhe input signal is inactive LOW, the input terminal 290 of the CMOS inverter 284 is HIGH so that the NMOS pulldown transistor 286 is turned on and the output terminal 282 of the CMOS inverter 284 is LOW to precharge the preboost node 262. For the gate preboost precharge circuit, when the avhe input signal is active HIGH, the input terminal 290 of the CMOS inverter 284 is LOW so that the PMOS pullup transistor 288 is turned on which turns off the precharge transistor 280.

Figure 3:
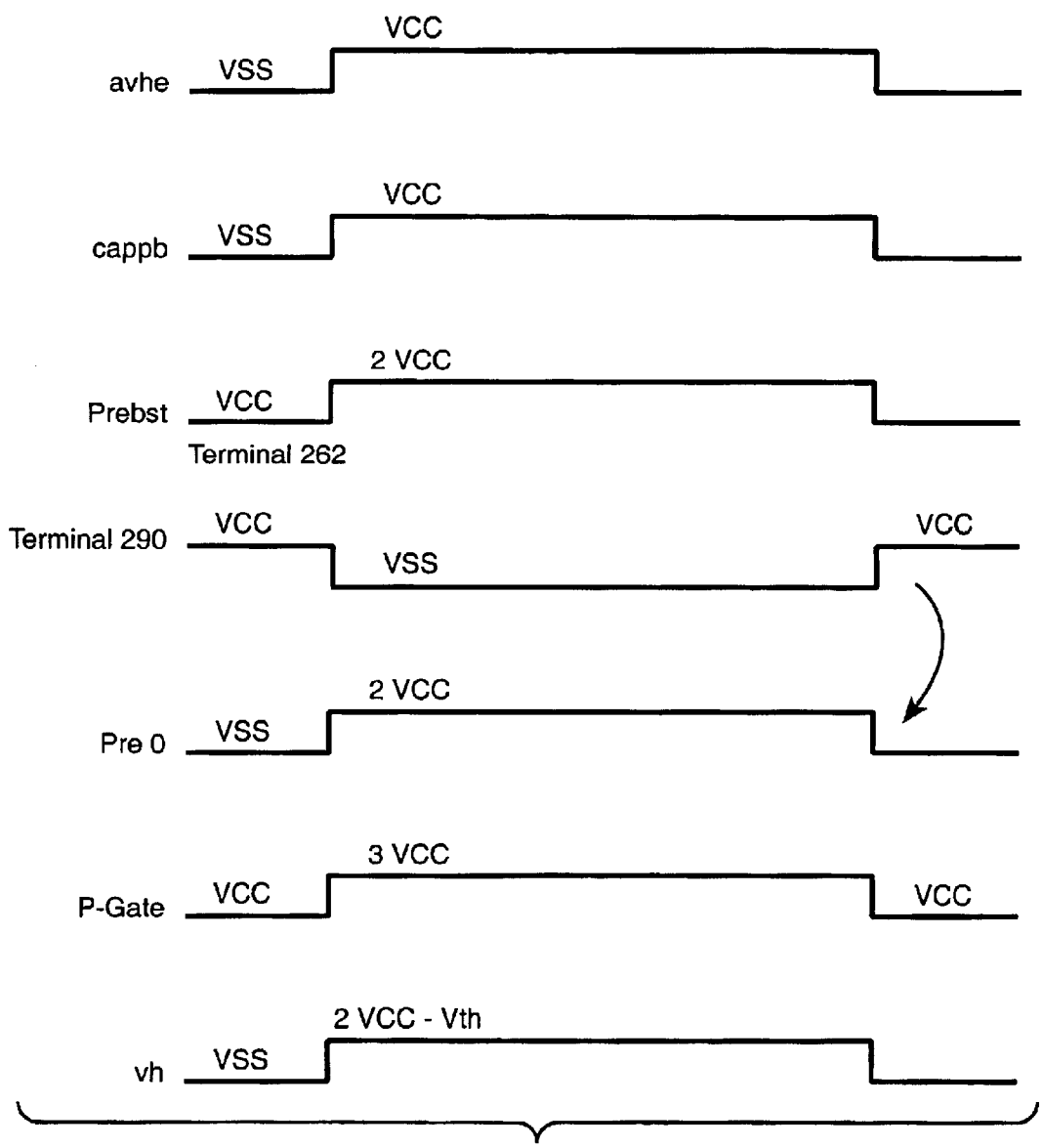
FIG. 3 is a timing chart illustrating various signals of the boost and preboost circuit of FIG. 2.

FIG. 3 is a timing chart illustrating various signals of the preboosted boost circuit of FIG. 2 using the pre-boost circuit to boost the gate input terminal 104 of the NMOS output pass transistor 102 to a higher voltage. The timing chart illustrates the high-voltage enable input signal avhe at input terminal 112. The Cappb signal at terminal 268 is the signal at the second terminal of the gate preboost capacitor 266. The Prebst signal at the preboost node 262 is shown. The signal at terminal 290 is the input signal to the CMOS inverter 284 that provides the pre Ø signal that controls operation of the PMOS precharge transistor 280. The P-gate signal at the gate terminal 104 of the NMOS pass transistor 102 has a level that is preboosted and boosted to 3 VCC. The high voltage output signal is boosted to 2 VCC-vth. For VCC equal to 1.5 volts, vh is 2.3 volts.

When the avhe signal goes HIGH, the signal at terminal 268 goes HIGH after a slight delay to boost the voltage at the preboost node 262 to 2 VCC. When the avhe signal goes HIGH, the signal at terminal 290 goes LOW after a slight delay to cutoff. precharging of the preboost node 262 by the PMOS precharging transistor 280. The signal at the gate 104 of the NMOS pass transistor 102 goes from VCC to 3 VCC using the preboost circuit and the boost circuit. The higher gate voltage causes the drain boost to be more efficiently driven to the output terminal.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A voltage boosting circuit that operates entirely from a single, common VCC voltage supply for boosting the output voltage of a wordline driver for a DRAM circuit, comprising:

an NMOS pass transistor having a gate input terminal, a drain terminal, and a source output terminal at which is provided a boosted output voltage vh for a wordline of a DRAM;

a gate boost capacitor having a first terminal connected to the gate input terminal of the NMOS pass transistor and having a second terminal;

a gate precharge circuit connected to the gate input terminal of the NMOS pass transistor for precharging the first terminal of the gate boost capacitor from the common VCC voltage supply, wherein said gate precharge circuit has a PMOS gate precharge transistor that has its source terminal connected to the common VCC voltage supply and that has a drain terminal and a substrate terminal connected together in common to the first terminal of the gate boost capacitor;

means for connecting the second terminal of the gate boost capacitor to a common ground while the gate precharge circuit precharges the first terminal of the gate boost capacitor from the common VCC voltage supply to provide a precharged gate boost capacitor;

means for connecting the second terminal of the precharged gate boost capacitor to the common VCC voltage level to thereby boost the precharged gate input terminal voltage to 2 VCC;

a drain boost capacitor having a first terminal connected to the drain input terminal of the NMOS pass transistor and having a second terminal;

a drain precharge circuit connected to the drain terminal of the NMOS pass transistor for precharging the drain terminal of the NMOS pass transistor with the common VCC voltage supply, wherein said drain precharge circuit has a PMOS drain precharge transistor that has its source terminal connected to the common VCC voltage supply and that has its drain terminal and a substrate terminal connected together in common to the drain terminal of the NMOS pass transistor to precharge the drain terminal of the NMOS pass transistor;

means for connecting the second terminal of the drain boost capacitor to a common ground, while the drain precharge circuit precharges the first terminal of the drain boost capacitor from the common VCC voltage supply to provide a precharge drain boost capacitor;

means for connecting the second terminal of the drain boost capacitor to the common VCC voltage level to thereby boost the precharged drain terminal voltage to 2 VCC and to provide a boosted output voltage for a wordline of a DRAM at a level of 2 VCC minus the threshold voltage for the NMOS pass transistor.

2. The circuit of claim 1 wherein the means for connecting the second terminal of the gate boost capacitor to the common ground and the means for connecting the second terminal of the precharge gate boost capacitor to the common VCC voltage include a CMOS gate circuit having an input terminal and having an output terminal that is connected through a PMOS pullup transistor to the common VCC voltage to thereby boost the gate voltage of the NMOS pass transistor to twice the VCC voltage or that is alternatively connected through an NMOS transistor to ground voltage during precharging of the gate boost capacitor.

3. The circuit of claim 1 wherein the means for connecting the second terminal of the drain boost capacitor to the common ground and the means for connecting the second terminal of the precharged drain boost capacitor to the common VCC voltage include a CMOS gate circuit having an input terminal and having an output terminal that is connected through a PMOS pullup transistor to the common VCC voltage to thereby boost the drain voltage of the NMOS pass transistor to twice the VCC voltage and that is alternatively connected through an NMOS pulldown transistor to ground voltage during precharging of the drain boost capacitor.

4. The circuit of claim 1 wherein the PMOS gate precharge transistor has a gate terminal that is connected to an output terminal of a CMOS precharge inverter that has an NMOS pulldown transistor and a PMOS pullup transistor having a source terminal connected to the first terminal of the gate boost capacitor and to the gate terminal of the NMOS pass transistor.

5. The circuit of claim 1 wherein the PMOS drain precharge transistor has a gate terminal that is connected to an output terminal of a CMOS precharge inverter that has an NMOS pulldown transistor and a PMOS pullup transistor having a source terminal connected to the first terminal of the drain boost capacitor and to the drain terminal of the NMOS pass transistor.

6. The circuit of claim 1 including a logic circuit that receives a high-voltage enable signal avhe and that provides control signals for activating the gate precharge circuit and the drain precharge circuit or alternatively for boosting the voltage on the gate and drain terminals of the NMOS pass transistor to provide a boosted output voltage vh for a wordline of a DRAM.

7. A voltage boosting circuit that operates entirely from a single, common VCC voltage supply for boosting the output voltage of a wordline driver for a DRAM circuit, comprising:

an NMOS pass transistor having a gate input terminal, a drain terminal, and a source output terminal at which is provided a boosted output voltage vh for a wordline of a DRAM;

a gate preboost capacitor having a first terminal connected to a gate preboost terminal and having a second terminal;

a gate preboost precharge circuit connected to the gate preboost terminal for precharging the first terminal of the gate preboost capacitor from the common VCC voltage supply, wherein said gate preboost precharge circuit has a PMOS precharge transistor that has its source terminal connected to the common VCC voltage supply and that has a drain terminal and a substrate terminal connected together in common to the first terminal of the gate preboost capacitor and to the gate preboost terminal;

means for connecting the second terminal of the gate preboost capacitor to a common ground while the gate preboost precharge circuit precharges the first terminal of the preboost capacitor from the common VCC voltage supply to provide a precharged gate preboost capacitor;

means for connecting the second terminal of the precharged gate preboost boost capacitor to the common VCC voltage to thereby boost the precharged gate preboost terminal voltage to 2 VCC;

a gate boost capacitor having a first terminal connected to the gate input terminal of the NMOS pass transistor and having a second terminal;

a gate precharge circuit connected to the gate input terminal of the NMOS pass transistor for precharging the first terminal of the gate boost capacitor from the common VCC voltage supply, wherein said gate precharge circuit has a PMOS gate precharge transistor that has its source terminal connected to the gate preboost terminal and that has a drain terminal and a substrate terminal connected together in common to the first terminal of the gate boost capacitor;

means for connecting the second terminal of the gate boost capacitor to a common ground while the gate precharge circuit precharges the first terminal of the gate boost capacitor from the common VCC voltage supply to provide a precharged gate boost capacitor;

means for connecting the second terminal of the precharged gate boost capacitor to the precharge terminal that has been precharged to 2 VCC to thereby boost the precharged gate input terminal voltage to 3 VCC;

a drain boost capacitor having a first terminal connected to the drain input terminal of the NMOS pass transistor and having a second terminal;

a drain precharge circuit connected to the drain terminal of the NMOS pass transistor for precharging the drain terminal of the NMOS pass transistor with the common VCC voltage supply, wherein said drain precharge circuit has a PMOS drain precharge transistor that has its source terminal connected to the common VCC voltage supply and that has its drain terminal and a substrate terminal connected together in common to the drain terminal of the NMOS pass transistor to precharge the drain terminal of the NMOS pass transistor;

means for connecting the second terminal of the drain boost capacitor to a common ground, while the drain precharge circuit precharges the first terminal of the drain boost capacitor from the common VCC voltage supply to provide a precharge drain boost capacitor;

means for connecting the second terminal of the drain boost capacitor to the common VCC voltage level to thereby boost the precharged drain terminal voltage to 2 VCC and to provide a boosted output voltage for a wordline of a DRAM at a level of 2 VCC minus the threshold voltage for the NMOS pass transistor.

8. The circuit of claim 7 wherein the means for connecting the second terminal of the gate preboost capacitor to the common ground and the means for connecting the second terminal of the preboost capacitor to the common VCC voltage include a CMOS gate circuit having an input terminal and having an output terminal that is connected through a PMOS pullup transistor to the common VCC voltage to thereby boost the gate preboost terminal to twice the VCC voltage or that is alternatively connected through an NMOS transistor to ground voltage during precharging of the gate preboost capacitor.

9. The circuit of claim 7 wherein the means for connecting the second terminal of the gate boost capacitor to the common ground and the means for connecting the second terminal of the precharge gate boost capacitor to the gate preboost terminal include a CMOS gate circuit having an input terminal and having an output terminal that is connected through a PMOS pullup transistor to the gate preboost terminal to thereby boost the gate voltage of the NMOS pass transistor to three times the VCC voltage or that is alternatively connected through an NMOS transistor to ground voltage during precharging of the gate boost capacitor.

10. The circuit of claim 7 wherein the means for connecting the second terminal of the drain boost capacitor to the common ground and the means for connecting the second terminal of the precharged drain boost capacitor to the common VCC voltage include a CMOS gate circuit having an input terminal and having an output terminal that is connected through a PMOS pullup transistor to the common VCC voltage to thereby boost the drain voltage of the NMOS pass transistor to twice the VCC voltage and that is alternatively connected through an NMOS pulldown transistor to ground voltage during precharging of the drain boost capacitor.

11. The circuit of claim 7 wherein the PMOS gate precharge transistor has a gate terminal that is connected to an output terminal of a CMOS precharge inverter that has an NMOS pulldown transistor and a PMOS pullup transistor having a source terminal connected to the first terminal of the gate boost capacitor and to the gate terminal of the NMOS pass transistor.

12. The circuit of claim 7 wherein the PMOS drain precharge transistor has a gate terminal that is connected to an output terminal of a CMOS precharge inverter that has an NMOS pulldown transistor and a PMOS pullup transistor having a source terminal connected to the first terminal of the drain boost capacitor and to the drain terminal of the NMOS pass transistor.

13. The circuit of claim 7 including a logic circuit that receives a high-voltage enable signal avhe and that provides control signals for activating the gate precharge circuit and the drain precharge circuit or alternatively for boosting the voltage on the gate and drain terminals of the NMOS pass transistor to provide a boosted output voltage vh for a wordline of a DRAM.

* * * * *